(12) United States Patent
Hwang et al.

(10) Patent No.: US 6,797,645 B2
(45) Date of Patent: Sep. 28, 2004

(54) METHOD OF FABRICATING GATE DIELECTRIC FOR USE IN SEMICONDUCTOR DEVICE HAVING NITRIDATION BY ION IMPLANTATION

(75) Inventors: Hyun Sang Hwang, Kwangju (KR); Sang Hun Jeon, Kunsan-shi (KR)

(73) Assignee: Kwangju Institute of Science and Technology, Kwangju (KR)

( * ) Notice: Subject to any disclaimer, the term of this patent is extended or adjusted under 35 U.S.C. 154(b) by 0 days.

(21) Appl. No.: 10/118,046

(22) Filed: Apr. 9, 2002

(65) Prior Publication Data

US 2003/0190790 A1 Oct. 9, 2003

(51) Int. Cl.$^7$ .............................................. H01L 21/31
(52) U.S. Cl. ...................... 438/775; 438/261; 438/766; 438/287
(58) Field of Search ................................ 438/261, 287, 438/761–765, 775, 785–787

(56) References Cited

U.S. PATENT DOCUMENTS 6,020,024 A * 2/2000 Maiti et al. ................. 438/439
6,020,243 A * 2/2000 Wallace et al. ............. 438/287

OTHER PUBLICATIONS

Jeon et al.; "Electrical Characteristics of Thermally Stable $ZrO_xN_y$,"; Gate Stack and Silicide Issues In Si Processing II, Symposium K, pp. 204, 210 and 211, (2001).

* cited by examiner

Primary Examiner—Carl Whitehead, Jr.
Assistant Examiner—Yennhu B. Huynh
(74) Attorney, Agent, or Firm—Finnegan, Henderson, Farabow, Garrett & Dunner, LLP

(57) ABSTRACT

Disclosed is a method of fabricating gate dielectric for use in semiconductor device having a high dielectric constant comprising formation of a metal oxide or a metal silicate on a silicon substrate, nitridation to incorporate nitrogen component to said metal oxide and reoxidation of said metal oxide that contains said nitrogen component. In this invention, the nitridation can be performed via heat-treatment of the resulting product, wherein said metal oxide is formed within, in a nitrogen-containing gas atmosphere; performed by plasma treatment by exposing said metal oxide to a nitrogen-containing plasma atmosphere; or performed by ion instillation of nitrogen component to said metal oxide, thereby providing a gate dielectric for use in semiconductor device which is able to remarkably inhibit the increase in effective thickness resulted from a post heat-treatment at high temperature by forming a film of metal oxide such as $ZrO_2$ followed by nitridation and reoxidation.

5 Claims, 2 Drawing Sheets

Capacitance equivalent oxide thickness (CET) of $ZrO_xN_y$ and sputtered $ZrO_2$ versus post-annealing temperatures High resolution TEM images of $ZrO_xN_y$ annealed at 800°C for 5min Capacitance equivalent oxide thickness (CET) of $ZrO_xN_y$, and sputtered $ZrO_2$ versus post-annealing temperatures Leakage current density of $ZrO_xN_y$, and sputtered $ZrO_2$ versus post-annealing temperature High resolution TEM images of ZrO₂ annealed at 800°C for 5min.

High resolution TEM images of ZrO$_x$N$_y$ annealed at 800°C for 5min

METHOD OF FABRICATING GATE DIELECTRIC FOR USE IN SEMICONDUCTOR DEVICE HAVING NITRIDATION BY ION IMPLANTATION

FIELD OF THE INVENTION

The present invention relates to a method of fabricating gate dielectric for use in semiconductor device, and more particularly, to a method of fabricating gate dielectric for use in semiconductor device having a high dielectric constant via nitridation.

BACKGROUND OF THE INVENTION

Thin $ZrO_2$ film, a film that has been spotlighted as a gate dielectric with high dielectric constant for next generation, is reported to enable to have excellent electrical properties via various processing optimizations. However, as is the case with other metal oxides, it becomes inevitable to perform heat treatment for thin film of $ZrO_2$ at a relatively high temperature when using the thin $ZrO_2$ film as a dielectric gate for MOSFET, and this results in the drastic increase in effective thickness due to the growth(increase) in interfacial layer of silicate or silicon oxide which is formed in the interface between silicon substrate and thin film of $ZrO_2$.

SUMMARY OF THE INVENTION

The present invention relates to a method of fabricating gate dielectric for use in semiconductor device having a high dielectric constant comprising formation of a metal oxide on a silicon substrate, nitridation to incorporate nitrogen component to said metal oxide and reoxidation of said metal oxide that contains said nitrogen component. Examples of said metal oxides include $ZrO_2$, $HfO_2$, $La_2O_3$, $Al_2O_3$ and $Ta_2O_5$, and other metal silicates such as $ZrSi_xO_y$, $HfSi_xO_y$, $LaSi_xO_y$, $AlSi_xO_y$ and $TaSi_xO_y$ can be also used for the same purpose. Further, the nitridation can be performed by heat-treating the resulting product, wherein said metal oxide is formed within, in a nitrogen-containing gas atmosphere; performed by plasma treatment by exposing said metal oxide to a nitrogen-containing plasma atmosphere; or performed by ion implantation of nitrogen component to said metal oxide.

Therefore, the object of the present invention is to provide a gate dielectric for use in semiconductor device which is able to remarkably inhibit the increase effective thickness resulted from a post heat-treatment at high temperature by performing steps of forming a film of metal oxide such as $ZrO_2$ followed by nitridation and reoxidation.

DETAILED DESCRIPTION OF THE INVENTION

The present invention relates to a method of fabricating gate dielectric for use in semiconductor device having a high dielectric constant comprising formation of a metal oxide on a silicon substrate, nitridation to incorporate nitrogen component to said metal oxide and reoxidation of said metal oxide that contains said nitrogen component. Examples of said metal oxides are $ZrO_2$, $HfO_2$, $La_2O_3$, $Al_2O_3$ and $Ta_2O_5$ and other metal silicate such as $ZrSi_xO_y$, $HfSi_xO_y$, $LaSi_xO_y$, $AlSi_xO_y$ and $TaSi_xO_y$ can be also used.

The nitridation can be performed by heat-treating the resulting product, wherein said metal oxide is formed, in an atmosphere of nitrogen-containing gas atmosphere, performed by plasma treatment by exposing said metal oxide to a nitrogen-containing plasma atmosphere, or performed by ion instillation of nitrogen component to said metal oxide. The nitrogen-containing gas that can be used in the present invention are $N_2O$, $NO$ or $NH_3$, and the heat-treatment is performed for 10 sec–1 hr. The nitrogen-containing plasma that can be used in the present invention is $N_2$ or $NH_3$.

The reoxidation is performed via heat-treatment in an atmosphere of $O_2$, $O_3$ or $H_2O(g)$ for 10 sec–1 hr at a temperature ranging from 300° C. to 1000° C.

This invention is explained in more detail based on the following Examples but they should not be construed as limiting the scope of this invention.

EXAMPLE 1

First, $ZrO_2$ film is deposited on silicon substrate. Then, the $ZrO_2$ film is exposed to an atmosphere of $NH_3$ gas and nitrogen component is incorporated into the $ZrO_2$ film via heat-treatment for 60 sec at 700° C. Then, the nitrogen-containing $ZrO_2$ film is reoxidized via wet oxidation in $H_2O$ vapor ambient at 425° C. and finally $ZrO_xN_y$ film is obtained.

EXAMPLE 2

First, $ZrO_2$ film is deposited on silicon substrate. Then, the $ZrO_2$ film is exposed to an atmosphere of $NH_3$ or $N_2$ plasma and nitrogen component is incorporated into the $ZrO_2$ film. Then, the nitrogen-containing $ZrO_2$ film is reoxidized by exposing it to oxygen-containing plasma and $ZrO_xN_y$ film is obtained.

EXAMPLE 3

First, $ZrO_2$ film is deposited on silicon substrate. Then, nitrogen component is incorporated into the $ZrO_2$ film via ion implantation of nitrogen component and heat-treatment. Then, the nitrogen-containing $ZrO_2$ film is reoxidized via wet oxidation in $H_2O$ vapor ambient at 425° C. and $ZrO_xN_y$ film is obtained.

Comparative Example 1

Figure 1:
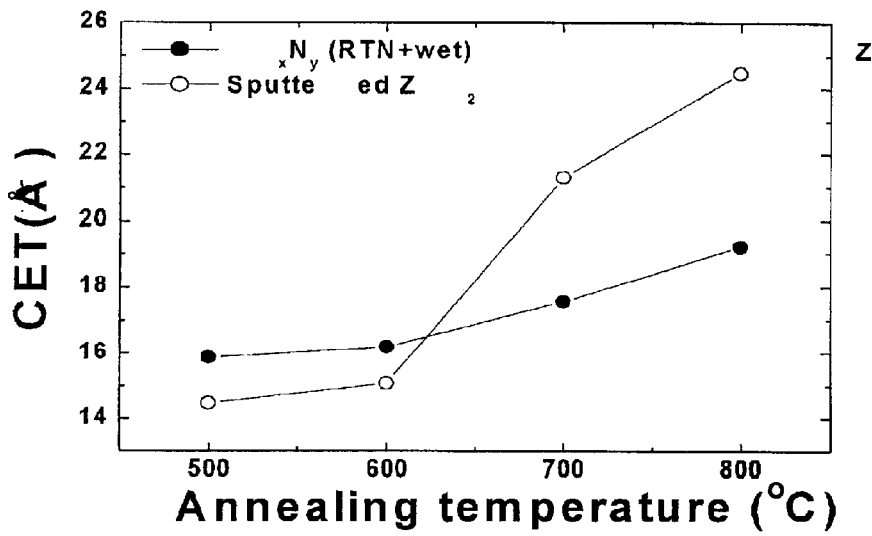
FIG. 1 is a graph that shows the increase in effective thickness for $ZrO_xN_y$ and $ZrO_2$ films at the time of post-heat-treatment.

FIG. 1 is a graph that comparatively shows the increase in effective thickness for the $ZrO_xN_y$ film formed in the Example 1 and the conventional $ZrO_2$ film at the time of post-heat-treatment. The result shows that the increase in effective thickness for the $ZrO_xN_y$ film is far smaller than that of the conventional $ZrO_2$ film.

Comparative Example 2

Figure 2:
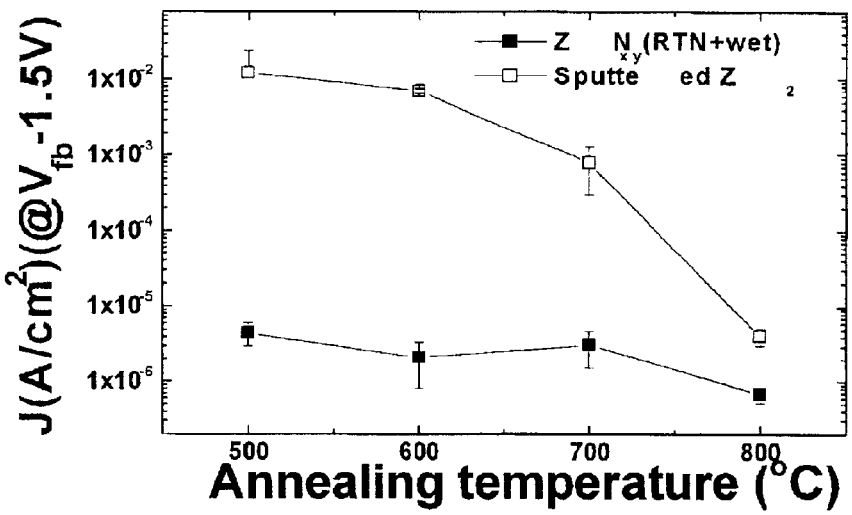
FIG. 2 is a graph that shows the decrease in leakage current for $ZrO_xN_y$ and $ZrO_2$ films at the time of post-heat-treatment.

FIG. 2 is a graph that comparatively shows the leakage current for the $ZrO_xN_y$ film formed in the Example 1 and the conventional $ZrO_2$ film at the time of post-heat-treatment. The leakage current was measured under the applied gate voltage of 1.5 V below the flatband voltage. The result shows that the leakage current in the conventional $ZrO_2$ film drops drastically at a temperature above 700° C., however, the leakage current of the conventional $ZrO_2$ film as a whole is shown greater than that of the $ZrO_xN_y$ film. In particular, the leakage current of the conventional $ZrO_2$ film at a temperature below 700° C. is shown far greater than that of the $ZrO_xN_y$ film.

The $ZrO_xN_y$ film is able to retain the amorphous structure after post-heat-treatment, whereas the $ZrO_2$ film becomes crystallized by the post-heat-treatment and forms a polycrystalline structure thus resulting in having a greater leakage current than that of the $ZrO_xN_y$ film when the effective thickness is the same.

Comparative Example 3

Figure 3A:
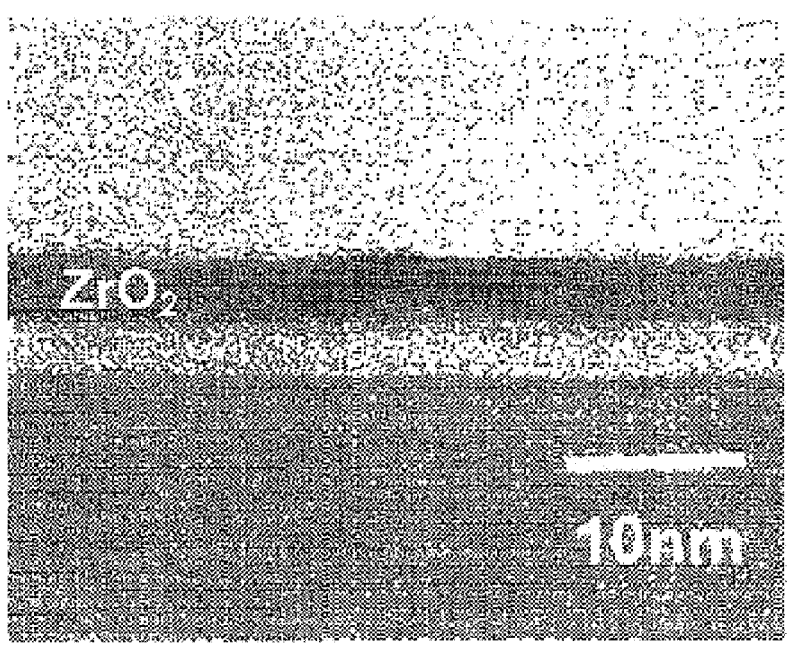
FIGS. 3a and 3b are cross-sectional images taken by electron microscopy of $ZrO_xN_y$ and $ZrO_2$ films heat-treated for 5 min at 800° C.
Figure 3B:
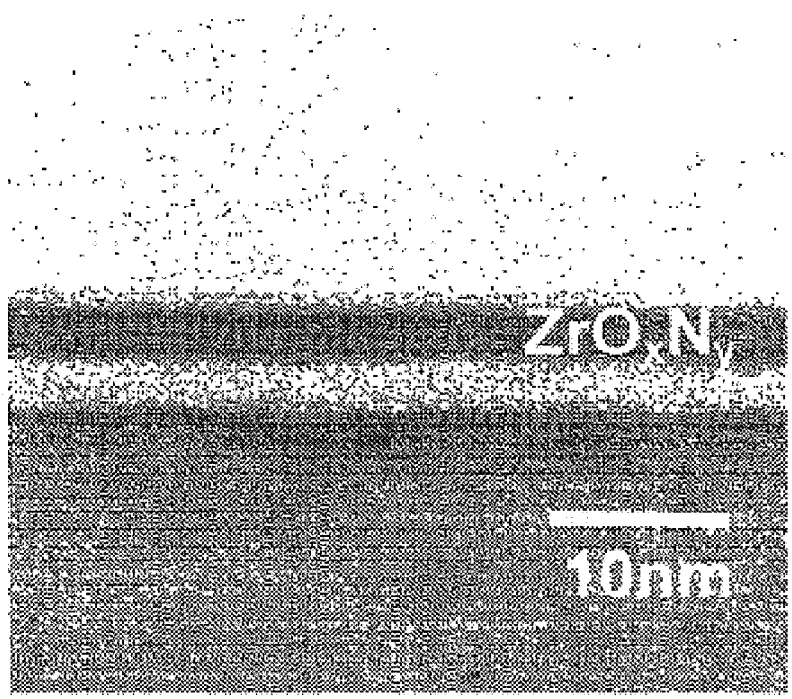

FIGS. 3a and 3b respectively shows a cross-sectional image by electron microscopy of $ZrO_2$ film formed by Sputtering method and $ZrO_xN_y$ film formed in the Example 1 after heat-treatment for 5 min at 800° C. The results show that there are interfacial layers formed in both films, however, the physical thickness of FIG. 3a is shown to be greater than that in FIG. 3b.

The present invention specifically discloses a method of fabricating $ZrO_xN_y$ film, however, this method can be also applied to general metal oxide films. According to the method of fabricating gate dielectric for use in semiconductor device of the present invention, the increase in effective thickness resulted from a post heat-treatment at high temperature remarkably dropped by performing steps of forming a film of metal oxide such as $ZrO_2$ followed by nitridation and reoxidation.

Although this invention has been described in its preferred form with a certain degree of particularity, it is appreciated by those skilled in the art that the present disclosure of the preferred form has been made only by way of examples and that numerous changes in the details of the construction, combination, and arrangement of parts may be resorted to without departing from the spirit and scope of the invention.

What is claimed is:

1. A method of fabricating a gate dielectric for use in a semiconductor device comprising the steps of:

(a) forming a metal oxide or a metal silicate on a silicon substrate, (b) after forming said metal oxide or said metal silicate introducing nitrogen in said metal oxide or said metal silicate by ion implantation to form a nitrided metal oxide or metal silicate, and (c) after forming said nitrided metal oxide or metal silicate reoxidizing said nitrided metal oxide or metal silicate to form an amorphous nitrided metal oxide or metal silicate, wherein said reoxidizing step is performed at a temperature ranging from 300° C. to 1000° C. for a time in the range of from 10 seconds to 1 hr, said amorphous material being resistant to crystallization by subsequent heat-treatment.

2. The method of fabricating gate dielectric for use in semiconductor device according to claim 1, wherein said metal oxide is $ZrO_2$.

3. The method of fabricating gate dielectric for use in semiconductor device according to claim 1, wherein said metal oxide is selected from the group consisting of $ZrO_2$, $HfO_2$, $La_2O_3$, $Al_2O_3$, and $Ta_2O_5$.

4. The method of fabricating gate dielectric for use in semiconductor device of claim 1, wherein said metal silicate is selected from the group consisting of $ZrSi_xO_y$, $HfSi_xO_y$, $LaSi_xO_y$, $AlSi_xO_y$, and $TaSi_xO_y$.

5. The method of fabricating gate dielectric for use in semiconductor device according to claim 1, wherein said reoxidizing step is a heat-treatment in an atmosphere of $O_2$, $O_3$, or $H_2O(g)$.

* * * * *

UNITED STATES PATENT AND TRADEMARK OFFICE
CERTIFICATE OF CORRECTION

PATENT NO. : 6,797,645 B2
DATED : September 28, 2004
INVENTOR(S) : Hyun Sang Hwang et al.

It is certified that error appears in the above-identified patent and that said Letters Patent is hereby corrected as shown below:

Title page, Item [54] and Column 1, lines 3-4,
Title, after "DEVICE" delete "HAVING NITRIDATION BY ION IMPLANTATION".

Column 4,
Line 31, "$AlSi_xO_y$and" should read -- $AlSi_xO_y$ and --.

Signed and Sealed this

Fifth Day of April, 2005

JON W. DUDAS
*Director of the United States Patent and Trademark Office*